(12) United States Patent
Yoon et al.

(10) Patent No.: US 9,412,903 B2
(45) Date of Patent: Aug. 9, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Ju Heon Yoon, Hwaseong-Si (KR); Joon Woo Jeon, Seoul (KR); Dong Hyuk Joo, Seoul (KR); Jin Young Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/601,190

(22) Filed: Jan. 20, 2015

(65) Prior Publication Data

US 2015/0207051 A1    Jul. 23, 2015

(30) Foreign Application Priority Data

Jan. 20, 2014 (KR) .................. 10-2014-0006667

(51) Int. Cl.
*H01L 33/12* (2010.01)
*H01L 33/14* (2010.01)
*H01L 33/38* (2010.01)

(52) U.S. Cl.
CPC .............. *H01L 33/14* (2013.01); *H01L 33/382* (2013.01)

(58) Field of Classification Search
CPC ....... H01L 33/00; H01L 33/005; H01L 33/12; H01L 33/24; H01L 33/46; H01L 33/60; H01L 33/62; H01L 33/486
See application file for complete search history.

(56) References Cited

U.S. PATENT DOCUMENTS

| | | |
|---|---|---|
| 6,372,608 B1 | 4/2002 | Shimoda et al. |
| 6,573,537 B1 | 6/2003 | Steigerwald et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,179,670 B2 | 2/2007 | Shelton et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |

(Continued)

FOREIGN PATENT DOCUMENTS

KR          10-0631970 B1    10/2006

*Primary Examiner* — Kyoung Lee
(74) *Attorney, Agent, or Firm* — Lee & Morse, P.C.

(57) ABSTRACT

A semiconductor light emitting device includes a stacked semiconductor structure including a first conductivity-type semiconductor layer having a top surface divided into a first region and a second region, and an active layer and a second conductivity-type semiconductor layer disposed sequentially on the second region of the first conductivity-type semiconductor layer. First and second contact electrodes are disposed in the first region of the first conductivity-type semiconductor layer and the second conductivity-type semiconductor layer, respectively. A current spreading layer is disposed on the second contact electrode and comprises a first conductive layer having a first resistivity and a second conductive layer having a second resistivity smaller than the first resistivity alternately stacked.

20 Claims, 20 Drawing Sheets

(56) References Cited

U.S. PATENT DOCUMENTS

| | | |
|---|---|---|
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2006/0081869 A1 | 4/2006 | Lu et al. |
| 2006/0261358 A1 | 11/2006 | Hwang et al. |
| 2011/0014734 A1 | 1/2011 | Lu |
| 2012/0056150 A1 | 3/2012 | Lee et al. |
| 2013/0020554 A1 | 1/2013 | Yang et al. |
| 2015/0108525 A1* | 4/2015 | Chae .................. H01L 33/40 257/98 |

\* cited by examiner

SEMICONDUCTOR LIGHT EMITTING DEVICE

CROSS-REFERENCE TO RELATED APPLICATION

This application claims the benefit of Korean Patent Application No. 10-2014-0006667 filed on Jan. 20, 2014, with the Korean Intellectual Property Office, the disclosure of which is incorporated herein by reference.

BACKGROUND

The present disclosure relates to a semiconductor light emitting device.

Semiconductor light emitting devices are devices generating light within a specific wavelength band using electron-hole combination. Since semiconductor light emitting devices have advantages, such as relatively long lifespans, low power consumption, and rapid initial start-up characteristics, compared to filament-based light sources, demand for semiconductor light emitting devices is constantly increasing. In particular, III-nitride semiconductors capable of emitting short-wavelength blue light are spotlighted.

Recently, research into improving the light emission efficiency of semiconductor light emitting devices has been actively conducted. In particular, various types of electrode structures are being developed in order to improve light emission efficiency and light emission amounts of semiconductor light emitting devices.

SUMMARY

An aspect of the present disclosure may provide a semiconductor light emitting device including a new electrode structure to prevent degradation of light emission efficiency due to a current crowding phenomenon and improve light output.

The technical objectives of the inventive concept are not limited to the above disclosure; other objectives may become apparent to those of ordinary skill in the art based on the following descriptions.

According to an aspect of the present disclosure, a semiconductor light emitting device includes a stacked semiconductor structure including a first conductivity-type semiconductor layer having a top surface divided into a first region and a second region, and an active layer and a second conductivity-type semiconductor layer disposed sequentially on the second region of the first conductivity-type semiconductor layer, a first contact electrode disposed in the first region of the first conductivity-type semiconductor layer, a second contact electrode disposed on the second conductivity-type semiconductor layer, a current spreading layer disposed on the second contact electrode and in which a first conductive layer having a first resistivity and a second conductive layer having a second resistivity smaller than the first resistivity are alternately stacked, a first electrode pad electrically connected to the first contact electrode, and a second electrode pad disposed on a portion of the current spreading layer and electrically connected to the second contact electrode.

A thickness of the first conductive layer may be less than a thickness of the second conductive layer.

In this case, the thickness of the first conductive layer may be ~30% or more of the thickness of the second conductive layer.

The first conductive layer may include at least one selected from the group consisting of Ti, V, Cr, Fe, Ni, Zn, Zr, Nb, Pt, Ta, Sn, TiN, Mn, Pb, and Te, and the second conductive layer may include at least one selected from the group consisting of Al, Cu, Cr, Ni, Au, Cu, W, Mo, Pd, Be, In, Os, Ir, Rh, TiW, and Ag.

The first contact electrode may include at least one finger electrode.

In some exemplary embodiments, the semiconductor light emitting device may further include an insulating layer disposed on the stacked semiconductor structure and including a first opening exposing a portion of the first contact electrode and a second opening exposing a portion of the current spreading layer. The first electrode pad may be connected to the first contact electrode through the first opening, and the second electrode pad may be connected to the current spreading layer through the second opening.

A portion of the first region, in which the first opening is disposed, may have a greater width than other portions of the first region adjacent to the first opening.

The first contact electrode may include at least one finger electrode, and the first opening may include a plurality of first openings. The plurality of first openings may be arranged to be spaced apart from each other on the finger electrode.

The second opening may include a plurality of second openings, and the finger electrode may extend between the plurality of second openings. In this case, the first opening may be located below the second electrode pad.

The finger electrode may include a plurality of finger electrodes.

The current spreading layer may have at least one area substantially corresponding to an area of the second contact electrode. In this case, the second contact electrode may be disposed in an area other than an area adjacent to an edge of a top surface of the second conductivity-type semiconductor layer.

At least one of the first and second contact electrodes may be at least one metal selected from the group consisting of Al, Ag, Ni, Rh, Pd, Ir, Ru, Mg, Zn, Pt, Au, Cr, and Ti.

The semiconductor light emitting device may further include a barrier layer interposed between the second contact electrode and the current spreading layer, or between the current spreading layer and the second electrode pad. In this case, the barrier layer may be at least one metal selected from the group consisting of Ni, Al, Cu, Cr, Ti, and combinations thereof.

According to another aspect of the present disclosure, a semiconductor light emitting device includes a stacked semiconductor structure including a first conductivity-type semiconductor layer having a top surface divided into a first region and a second region, and an active layer and a second conductivity-type semiconductor layer disposed sequentially on the second region of the first conductivity-type semiconductor layer, a first contact electrode disposed in the first region of the first conductivity-type semiconductor layer and including a plurality of finger electrodes, a second contact electrode disposed on a top surface of the second conductivity-type semiconductor layer, a current spreading layer disposed on the second contact electrode and in which a first conductive layer having a first resistivity and a second conductive layer having a second resistivity smaller than the first resistivity are alternately stacked, an insulating layer disposed on the stacked semiconductor structure and including a first opening exposing a portion of the first contact electrode and a second opening exposing a portion of the current spreading layer, a first electrode pad disposed on a portion of the insulating layer and electrically connected to the first contact electrode through the first opening, and a second electrode pad disposed on another portion of the insulating layer and electrically connected to the current spreading layer.

The first and second openings may include a plurality of first and second openings, respectively. The plurality of first openings may be arranged to be spaced apart from each other on the plurality of finger electrodes, and the plurality of finger electrodes may extend between the plurality of second openings.

The first and second electrode pads may be disposed adjacently to two opposite edges of the semiconductor light emitting device, and the plurality of finger electrodes may extend from below the first electrode pad to below the second electrode pad.

At least one of the first and second contact electrodes may be at least one metal selected from the group consisting of Al, Ag, Ni, Rh, Pd, Ir, Ru, Mg, Zn, Pt, Au, Cr, and Ti.

The first resistivity may be equal to three times the second resistivity or more. The first conductive layer may include at least one selected from the group consisting of Ti, V, Cr, Fe, Ni, Zn, Zr, Nb, Pt, Ta, Sn, TiN, Mn, Pb, and Te, and the second conductive layer may include at least one selected from the group consisting of Al, Cu, Cr, Ni, Au, Cu, W, Mo, Pd, Be, In, Os, Ir, Rh, TiW, and Ag. The first and second conductive layers may be respectively formed of different metals.

The insulating layer may be disposed in an area adjacent to an edge of the top surface of the second conductivity-type semiconductor layer.

The semiconductor light emitting device may further include a barrier layer interposed between the second contact electrode and the current spreading layer, or between the current spreading layer and the second electrode pad. The barrier layer may be at least one metal selected from the group consisting of Ni, Al, Cu, Cr, Ti, and combinations thereof.

According to another aspect of the present disclosure, a light emitting module includes a circuit board including a first electrode structure and a second electrode structure, and any one of the above-described semiconductor light emitting devices, mounted on the circuit board. First and second electrode pads of the semiconductor light emitting device are respectively connected to the first and second electrode structures.

According to another aspect of the present disclosure, an illuminating apparatus includes a light emitting module having any one of the above-described semiconductor light emitting device, a driving unit configured to drive the light emitting module, and an external connection portion configured to supply an external voltage to the driving unit.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
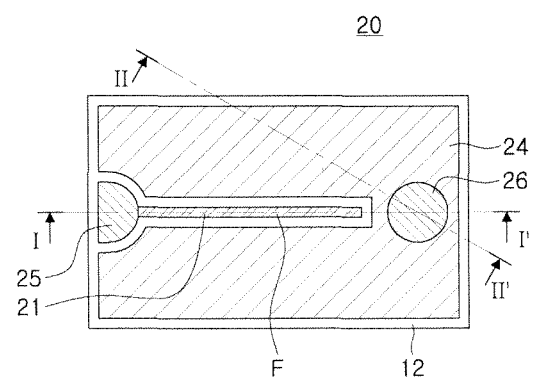
FIG. 1 is a plan view schematically illustrating a semiconductor light emitting device according to an exemplary embodiment of the present disclosure.

Exemplary embodiments of the present disclosure will now be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
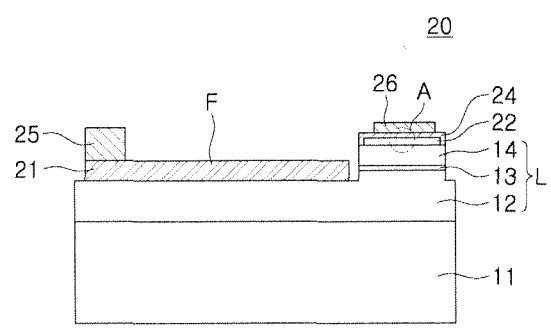
FIG. 2 is a schematic cross-sectional view taken along line I-I' of the semiconductor light emitting device illustrated in FIG. 1.
Figure 3:
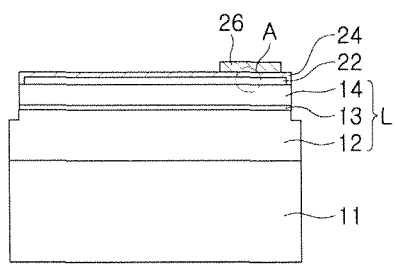
FIG. 3 is a schematic cross-sectional view taken along line II-II' of the semiconductor light emitting device illustrated in FIG. 1.

FIG. 1 is a plan view schematically illustrating a semiconductor light emitting device according to an exemplary embodiment of the present disclosure, and FIGS. 2 and 3 are schematic cross-sectional views respectively taken along lines I-I' and II-II' of the semiconductor light emitting device illustrated in FIG. 1.

Referring to FIG. 1 along with FIGS. 2 and 3, a semiconductor light emitting device 10 includes a substrate 11 and a stacked semiconductor structure L disposed on the substrate 11. The stacked semiconductor structure L may include a first conductivity-type semiconductor layer 12, an active layer 13, and a second conductivity-type semiconductor layer 14.

The substrate 11 may be an insulating substrate, a conductive substrate or a semiconductor substrate. For example, the substrate 11 may be sapphire, SiC, Si, $MgAl_2O_4$, MgO, $LiAlO_2$, $LiGaO_2$, or GaN.

The first conductivity-type semiconductor layer 12 may be a nitride semiconductor layer satisfying an n-type $Al_xIn_yGa_{1-x-y}N$ ($0 \le x < 1$, $0 \le y < 1$ and $0 \le x+y < 1$), wherein the n-type impurities may be Si. For example, the first conductivity-type semiconductor layer 12 may be n-type GaN. As the active layer 13, a multiple quantum well (MQW) structure in which quantum well layers and quantum barrier layers are alternately stacked may be used. For example, when the active layer 13 is a nitride semiconductor, a GaN/InGaN structure may be used. In addition, the active layer 13 may have a single quantum well (SQW) structure. The second conductivity-type semiconductor layer 14 may be a nitride semiconductor layer satisfying a p-type $Al_xIn_yGa_{1-x-y}N$ ($0 \le x < 1$, $0 \le y < 1$, and $0 \le x+y < 1$), wherein the p-type impurities may be Mg. For example, the second conductivity-type semiconductor layer 14 may be p-type AlGaN/GaN.

In the stacked semiconductor structure L according to the exemplary embodiment of the present disclosure, the first conductivity-type semiconductor layer 12 may have a region (referred to as a first region) exposed by an etching process, and the active layer 13 and the second conductivity-type semiconductor layer 14 may be located in an un-etched region (referred to as a second region). The semiconductor light emitting device 10 may include a first contact electrode 21 disposed in the first region of the first conductivity-type semiconductor layer 12, and a second contact electrode 22 disposed on the second conductivity-type semiconductor layer 14.

The first and second contact electrodes 21 and 22 are not limited thereto. The first and second contact electrodes 21 and 22 may include a material, such as Ag, Ni, Al, Rh, Pd, Ir, Ru, Mg, Zn, Pt, and Au, and have a structure of a single layer or a multiple layer. As needed, a reflective electrode structure is adopted to implement a flip-chip structure. For example, the first contact electrode 21 may include Cr/Au, and the second contact electrode 22 may include Ag.

The semiconductor light emitting device 10 may include first and second electrode pads 25 and 26 disposed on the first and second contact electrodes 21 and 22, respectively. The first and second electrode pads 25 and 26 may be located to be adjacent to two opposite edges, as illustrated in FIGS. 1 and 2. The first contact electrode 21 may include a finger electrode F. The finger electrode F may extend to the second electrode pad 26. The first and second electrode pads 25 and 26 may include Au, Sn, or Au/Sn.

Figure 4:
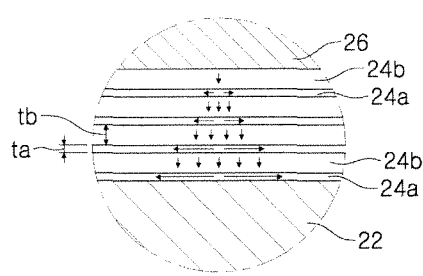
FIG. 4 is an enlarged schematic view of part A in the semiconductor light emitting device illustrated in FIG. 1.

The semiconductor light emitting device 10 according to the exemplary embodiment of the present disclosure may further include a current spreading layer 24 disposed on the second contact electrode 22. As illustrated in FIG. 4, the current spreading layer 24 may have a structure in which a first conductive layer 24a having a first resistivity and a second conductive layer 24b having a second resistivity smaller than the first resistivity are alternately stacked.

The first conductive layer 24a may include at least one selected from Ti, V, Cr, Fe, Ni, Zn, Zr, Nb, Pt, Ta, Sn, TiN, Mn, Pb, and Te. The second conductive layer 24b may include at least one selected from Al, Cu, Cr, Ni, Au, Cu, W, Mo, Pd, Be, In, Os, Ir, Rh, TiW, and Ag. The first and second conductive layers 24a and 24b may be appropriately selected from different respective metals. The first conductive layer 24a may be Ti, V, Cr, Fe, Co, Ni, Zn, Zr, Nb, or Ru, and the second conductive layer 24b may be Al, Cu, or Ag. For example, the first conductive layer 24a may be Ti (about $4.31 \times 10^{-7}$ $\Omega m$@295K), and the second conductive layer 24b may be Ag (about $1.61 \times 10^{-8}$ $\Omega m$@295K).

As illustrated in FIG. 4, since the first and second conductive layers 24a and 24b adopted in the current spreading layer 24 have different resistivity, current flows therein may have different trends from each other. A current flow in a width direction may be enhanced in the first conductive layer 24a because of having a relatively higher resistivity, and a current flow in a thickness direction may be enhanced because of relatively higher electrical conductivity being present in the second conductive layer 24b. Since the first and second conductive layers 24a and 24b are repeatedly alternately stacked, these two trends of the current flows may be repeated. As a result, currents in the current spreading layer 24 may be more uniformly distributed throughout the entire area without significant increase in a driving voltage.

Referring to FIG. 1, current flows applied to the first and second electrode pads 25 and 26 may be concentrated in an area between the second electrode pad 26 and an end of the Finger electrode F of the first contact electrode 21 adjacent to the second electrode pad 26. However, since the current flows throughout the entire area are enhanced by the current spreading layer 24 disposed below the second electrode pad 26, light can be uniformly emitted from the entire area of the semiconductor light emitting device 10.

A resistivity of the first conductive layer 24a may be equal to three times or more, and more preferably, equal to ten times or more the resistivity of the second conductive layer 24b. A thickness ta of the first conductive layer 24a may be less than a thickness tb of the second conductive layer 24b. In this case, the thickness ta of the first conductive layer 24a may be equal to 30% or more of the thickness tb of the second conductive layer 24b.

The second electrode pad 26 may be disposed in a portion of the current spreading layer 24. The current spreading layer 24 may have at least one area substantially corresponding to an area of the second contact electrode 22. As illustrated in FIG. 3, the current spreading layer 24 may have a cap structure covering the second contact electrode 22.

In other exemplary embodiments, the substrate 11 may be fully or partially removed or patterned before or after a light emitting device structure is grown, in order to improve optical or electrical characteristics of a light emitting device chip. For example, a sapphire substrate may be separated by using a laser beam irradiation, and a silicon or silicon carbide substrate may be removed using polishing, etching, or the like.

When the substrate 11 is to be removed, a support substrate may be used. In order to improve optical efficiency of the semiconductor light emitting device 10, a reflective material may be used to bond the support substrate and the substrate 11, or a reflective structure may be interposed between the substrate 11 and the support substrate.

When the substrate 11 is patterned, prominence and depression patterns or inclined planes may be formed before or after a single crystal is grown on a main surface (a surface or both surfaces) or a side surface of the substrate, to improve light extraction efficiency and crystallinity. The size of the patterns may be selected in the range of 5 nm to 500 μm, and any structure having regular or irregular patterns capable of improving light extraction efficiency may be used. The patterns may have various shapes, such as a pillar shape, a pyramidal shape, or a hemispherical shape.

Figure 5:
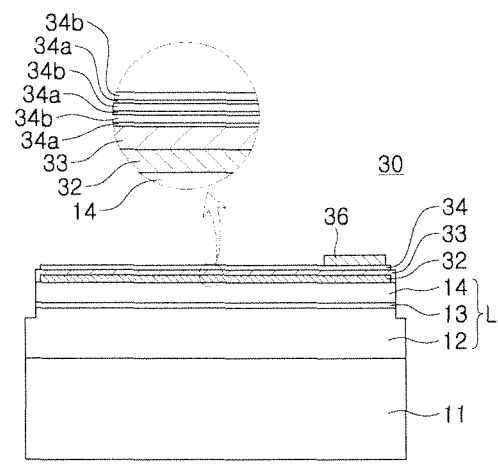
FIG. 5 is a cross-sectional view schematically illustrating a semiconductor light emitting device according to an exemplary embodiment of the present disclosure.

The electrode structure of the exemplary embodiment illustrated in FIG. 1 may be variously modified. FIG. 5 is a cross-sectional view illustrating an example in which a location of the current spreading layer is changed.

The semiconductor light emitting device 30 according to the exemplary embodiment of the present disclosure may include a stacked semiconductor structure L similar to the semiconductor light emitting device 10. FIG. 5 is a cross-sectional view corresponding to FIG. 3, and components which are not illustrated in FIG. 5, for example, a first contact electrode, may be the same as the exemplary embodiment illustrated in FIG. 1.

Referring to FIG. 5, the semiconductor light emitting device 30 may include a second contact electrode 32 disposed on the stacked semiconductor structure L to be connected to the second conductivity-type semiconductor layer 14, a barrier layer 33 disposed on the second contact electrode 32, and a current spreading layer 34 disposed on the barrier layer 33. An electrode pad 36 may be disposed on an area of the current spreading layer 34.

According to the exemplary embodiment of the present disclosure, the barrier layer 33 may be disposed between the second contact electrode 32 and the current spreading layer 34 to prevent undesired diffusion of elements to the second contact electrode 32. As illustrated in FIG. 5, the barrier layer 33 have a cap structure covering the second contact electrode 32. The barrier layer 33 may be a stable material different from the second contact electrode 32 and the current spreading layer 34. The barrier layer 33 may include, but not limited thereto, Ni, Al, Cu, Cr, Ti, or a combination thereof. For example, the barrier layer 33 may have a Ni/Ti layered structure or a structure in which Ni/Ti layers are repeatedly stacked.

The current spreading layer 34 may have a structure in which a first conductive layer 34a having a first resistivity and a second conductive layer 34b having a second resistivity smaller than the first resistivity are alternately stacked, similar to the exemplary embodiment illustrated in FIG. 1. The first conductive layer 34a may include at least one selected from Ti, V, Cr, Fe, Ni, Zn, Zr, Nb, Pt, Ta, Sn, TiN, Mn, Pb, and Te, and the second conductive layer 34b may include at least one selected from Al, Cu, Cr, Ni, Au, Cu, W, Mo, Pd, Be, In, Os, Ir, Rh, TiW, and Ag. The first and second conductive layers 34a and 34b may be appropriately selected from different respective metals.

As illustrated in FIG. 5, since the first and second conductive layers 34a and 34b having different resistivity are repeatedly and alternately stacked, currents in the current spreading layer 34 may be more uniformly distributed throughout the entire area without significantly increasing a driving voltage. In this exemplary embodiment, the current spreading layer 34 is disposed between the barrier layer 33 and the electrode pad 36 to distribute currents, but is not limited thereto. The current spreading layer 34 may be disposed between the barrier layer 33 and the second contact electrode 32.

Figure 6:
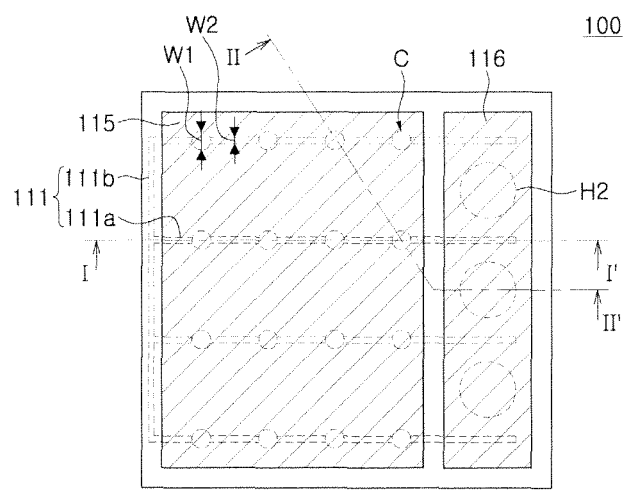
FIG. 6 is a plan view schematically illustrating a semiconductor light emitting device according to an exemplary embodiment of the present disclosure.
Figure 7:
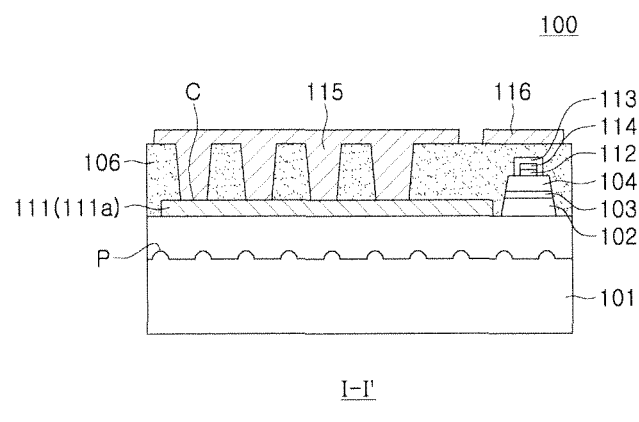
FIG. 7 is a schematic cross-sectional view taken along line I-I' of the semiconductor light emitting device illustrated in FIG. 6.
Figure 8:
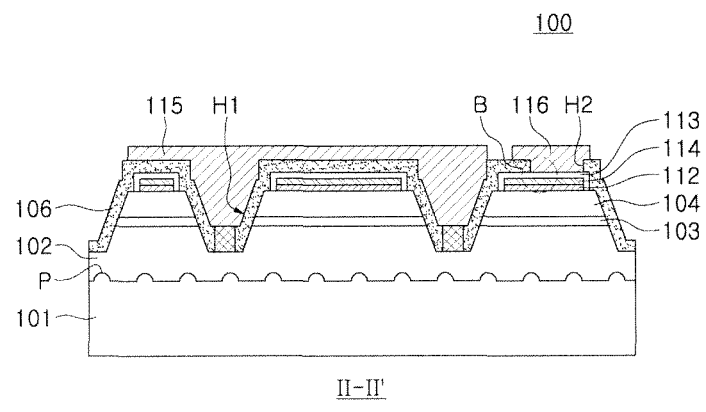
FIG. 8 is a schematic cross-sectional view taken along line II-II of the semiconductor light emitting device illustrated in FIG. 6.

FIG. 6 is a plan view schematically illustrating a semiconductor light emitting device according to an exemplary embodiment of the present disclosure, and FIGS. 7 and 8 are cross-sectional views respectively taken along lines I-I' and II-II' of the semiconductor light emitting device illustrated in FIG. 6.

Referring to FIG. 6 along with FIGS. 7 and 8, a semiconductor light emitting device 100 may include a substrate 101 and a stacked semiconductor structure L disposed on the substrate 101. The stacked semiconductor structure L may include a first conductivity-type semiconductor layer 102, an active layer 103, and a second conductivity-type semiconductor layer 104.

The substrate 101 may be an insulating substrate, a conductive substrate, or a semiconductor substrate. For example, the substrate 101 may be sapphire, SiC, Si, $MgAl_2O_4$, MgO, $LiAlO_2$, $LiGaO_2$, and GaN. A surface of the substrate 101 may include a hemispherical embossing structure P. The shape of the embossing structure P may be not limited thereto, and the embossing structure P may have another polyhedral structured or irregular shaped emboss.

The first conductivity-type semiconductor layer 102 may be a nitride semiconductor layer satisfying an n-type $Al_xIn_yGa_{1-x-y}N$ ($0 \le x<1$, $0 \le y<1$, and $0 \le x+y<1$), wherein the n-type impurities may be Si. For example, the first conductivity-type semiconductor layer 102 may be n-type GaN. As the active layer 103, an MQW structure in which quantum well layers and quantum barrier layers are alternately stacked may be used. For example, when the active layer 103 is a nitride semiconductor, a GaN/InGaN structure may be used. In addition, the active layer 103 may have a single quantum well (SQW) structure. The second conductivity-type semiconductor layer 104 may be a nitride semiconductor layer satisfying a p-type $Al_xIn_yGa_{1-x-y}N$ ($0 \le x<1$, $0 \le y<1$, and $0 \le x+y<1$), wherein the p-type impurities may be Mg. For example, the second conductivity-type semiconductor layer 104 may be p-type AlGaN/GaN.

In the stacked semiconductor structure L adopted in the exemplary embodiment of the present disclosure, the first conductivity-type semiconductor layer 102 may include, as illustrated in FIGS. 7 and 8, a region (referred to as a first region) exposed by an etching process, and the active layer 103 and the second conductivity-type semiconductor layer 104 may be located in an un-etched region (referred to as a second region).

In the exemplary embodiment of the present disclosure, the first region may provide an area in which the first contact electrode 111 is to be formed. The first contact electrode 111 may include four finger electrodes 111a, aligned in parallel, and a connection electrode 111b disposed at one ends of the finger electrodes 111a and connecting the finger electrodes 111a, but is not limited thereto. For example, connection electrode 111b may be omitted. The first region may be formed to correspond to the arrangement of the first contact electrode 111. A second contact electrode 112 may be disposed on the second region which is not etched, that is, the second conductivity-type semiconductor layer 104.

The first and second contact electrodes 111 and 112 are not limited thereto. The first and second contact electrodes 111 and 112 may include Ag, Ni, Al, Rh, Pd, Ir, Ru, Mg, Zn, Pt, Au, or the like, and may have a single layer structure or a multiple layer structure. For example, the first contact electrode 111 may include a Cr/Au layer, and the second contact electrode 112 may include Ag.

Figure 9:
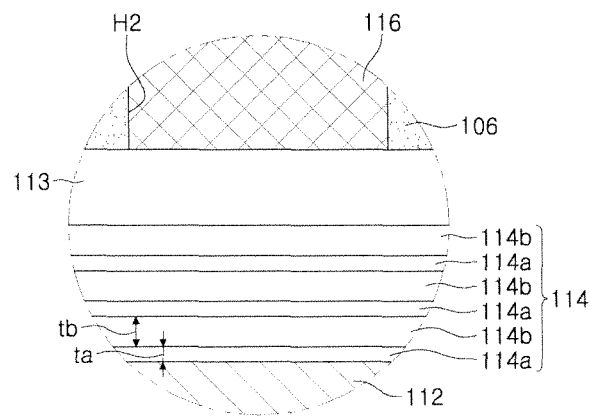
FIG. 9 is an enlarged schematic view of part B in the semiconductor light emitting device illustrated in FIG. 6.

As illustrated in FIG. 8, the semiconductor light emitting device 100 further includes a current spreading layer 114 disposed on the second contact electrode 112. The current spreading layer 114 may be formed to have an area substantially corresponding to an area of the second contact electrode 112. FIG. 9 illustrates an enlarged view of the part B of FIG. 8. Referring to FIG. 9, the current spreading layer 114 may have a structure in which a first conductive layer 114a having a first resistivity and a second conductive layer 114b having a second resistivity smaller than the first resistivity are alternately stacked.

The first resistivity of the first conductive layer may be three times or more, more preferably ten times or more than the second resistivity of the second conductive layer 114b. A thickness ta of the first conductive layer may be less than a thickness tb of the second conductive layer 114b. In this case, the thickness ta of the first conductive layer may be 30% or more of the thickness tb of the second conductive layer 114b. The first conductive layer may include at least one selected from Ti, V, Cr, Fe, Ni, Zn, Zr, Nb, Pt, Ta, Sn, TiN, Mn, Pb, and Te, and the second conductive layer 114b may include at least one selected from Al, Cu, Cr, Ni, Au, Cu, W, Mo, Pd, Be, In, Os, Ir, Rh, TiW, and Ag. The first and second conductive layers 114a and 114b may be appropriately selected from different respective metals.

As illustrated in FIG. 8, a barrier layer 113 may be formed on the current spreading layer 114. The barrier layer 113 may have a cap structure covering the second contact electrode 112 and the current spreading layer 114. The barrier layer 113 may be formed of a metal selected from the group including one or more of Ni, Al, Cu, Cr, Ti, and combinations thereof.

In the exemplary embodiment of the present disclosure, as illustrated in FIGS. 7 and 8, the semiconductor light emitting device 100 may include an insulating layer 106 disposed on the stacked semiconductor structure L. The insulating layer 106 may be $SiO_2$, SiN, or SiON. The insulating layer 106 may include a first opening H1 exposing a portion of the first contact electrode 111, and a second opening H2 exposing a portion of the barrier layer 113. In the exemplary embodiment of the present disclosure, a plurality of first and second openings H1 and H2 may be formed at regular intervals. For example, the plurality of first openings H1 may be arranged to be spaced apart from each other on the finger electrode 111a.

In the exemplary embodiment of the present disclosure, the portion of the barrier layer 113 is exposed through the second opening H2, but is not limited thereto. The barrier layer 113 may be omitted, or the barrier layer 113 may be disposed between the current spreading layer 114 and the second contact electrode 112 (refer to FIG. 5). In this case, the portion exposed by the second opening H2 may be a portion of the current spreading layer 114. The finger electrode 111a may be a portion connected to the first opening H1 that is, a contact area C may have a width w1 greater than a width w2 of other areas adjacent to the contact area C. Since the contact area C has relatively greater width, electrical connection through the first opening H1 may be easy.

Referring to FIGS. 6 and 8, first and second electrode pads 115 and 116 may be respectively disposed on the insulating layer 106. The first electrode pad 115 may be electrically connected to the contact area C of the first contact electrode 111 through the first opening H1. The second electrode pad 116 may be electrically connected to the current spreading layer 114 through the second opening H2. The first and second electrode pads 115 and 116 may include Au, Sn, or Au/Sn.

The first and second electrode pads 115 and 116 may be adjacent to opposite edges of the semiconductor light emitting device 100, as illustrated in FIG. 6. The plurality of finger electrodes 111a may extend from below the first electrode pad 115 to below the second electrode pad 116.

In the exemplary embodiment of the present disclosure, since each of the plurality of finger electrodes 111a extends to between the plurality of second openings H2, current flows to a stacked semiconductor area located below the second electrode pad 116 can be secured, and effective light emission in the active layer 103 located in the stacked semiconductor area can be achieved.

In this structure, since the current spreading layer 114 serves to enhance horizontal current flows in the entire region, current concentration in an area adjacent to the first and second contact electrodes 111 and 112 can be alleviated.

Figure 10A:
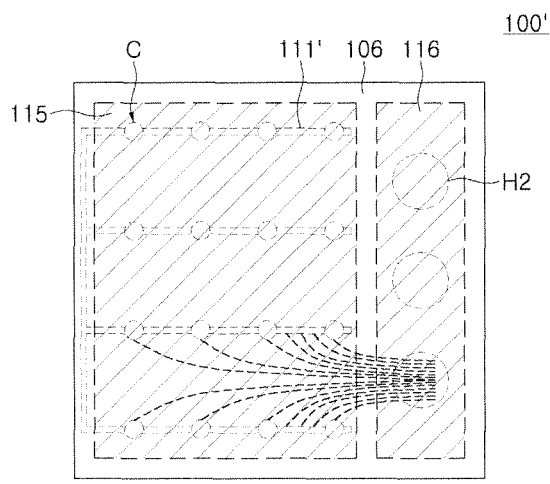
FIGS. 10A to 10C are plan views illustrating semiconductor light emitting devices according to Comparative Example 1, Comparative Example 2, and Exemplary Embodiment 1, respectively.
Figure 10B:
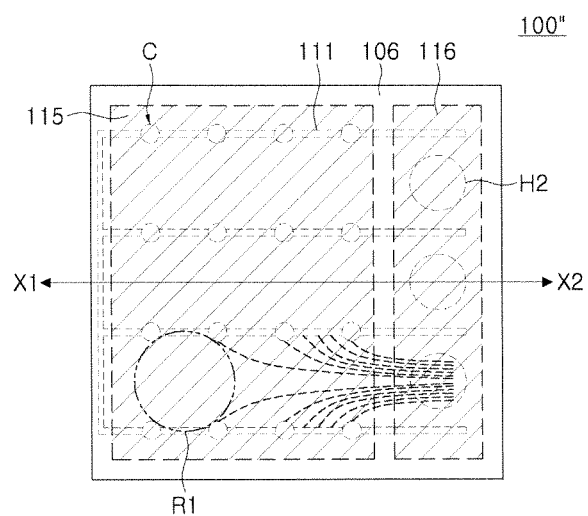
Figure 10C:
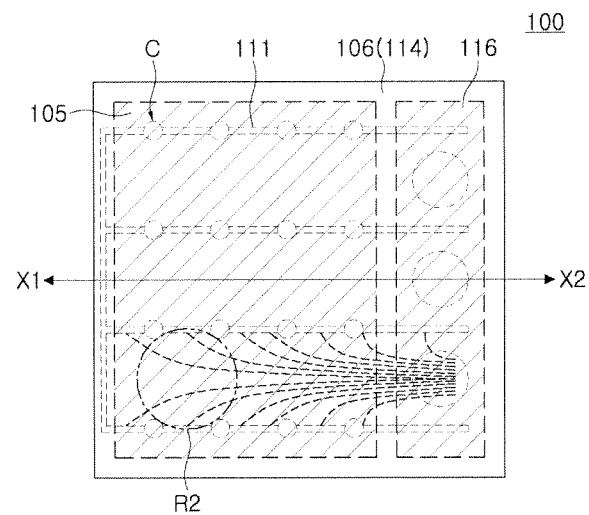

FIGS. 10A to 10C are plan views illustrating semiconductor light emitting devices according to Comparative Example 1, Comparative Example 2, and Exemplary Embodiment 1, respectively.

A semiconductor light emitting device 100' (Comparative Example 1) illustrated in FIG. 10A is similar to the above-described exemplary embodiment (see FIGS. 7 to 9), but different in that a first contact electrode 111' does not extend to below the second electrode pad 116 and the current spreading layer 114 is not adopted.

A semiconductor light emitting device 100" (Comparative Example 2) illustrated in FIG. 10B is similar to the above-described exemplary embodiment (see FIGS. 7 to 9), but different in that the current spreading layer 114 is not adopted. That is, the semiconductor light emitting device 100" according to Comparative Example 2 is different from the semiconductor light emitting device 100' according to Comparative Example 1 in that the first contact electrode 111 extends to below the second electrode pad 116.

A semiconductor light emitting device 100 (Exemplary Embodiment 1) illustrated in FIG. 10C corresponds to the above-described exemplary embodiment (see FIGS. 7 to 9).

Distribution of current around the second opening H2 (see dotted lines) when current is applied to the first and second electrode pads 115 and 116 is displayed in each plan view of the semiconductor light emitting devices illustrated in FIGS. 10A to 10C.

Referring to FIG. 10A, current flows are distributed between the second electrode pad 116 and the contact area C of the first contact electrode 111' and, in particular, concentrated in the contact area C adjacent to the second electrode pad 116. In addition, since current flows between the second openings H2 located below the second electrode pad 116 are rarely distributed, a non-emitting area that does not substantially contribute to light emission may be left.

On the contrary, in FIG. 10B, since the first contact electrode 111 extends to below the second electrode pad 116, currents may flow between the second openings H2, the active layer 103 disposed between the second openings H2 may also contribute to light emissions, and whereby an effective light emitting area may be increased. However, when operating conditions are the same as in Comparative Example 1, the concentration of current distribution is severed below the second electrode pad 116 and weakened in an area R1 located relatively far from the second electrode pad 116, as illustrated in FIG. 10B.

Such a current crowding problem can be effectively alleviated by adopting the current spreading layer (reference numeral 114 in FIGS. 8 and 9) proposed in the above-described embodiment of the present disclosure. As illustrated in FIG. 10C, even when the first contact electrode 111 extends to under the second electrode pad 116, current flow in an area R2 located relatively far from the second electrode pad 116 is improved by adopting the current spreading layer 114. Accordingly, current distribution is relatively uniform across the entire area.

In this way, the current crowding problem can be alleviated by adopting the current spreading layer 114 even when adjacent areas between electrodes locally exist in an electrode array. Through the improvement of current distribution, light emission efficiency of a semiconductor light emitting device can be significantly improved.

Figure 11A:
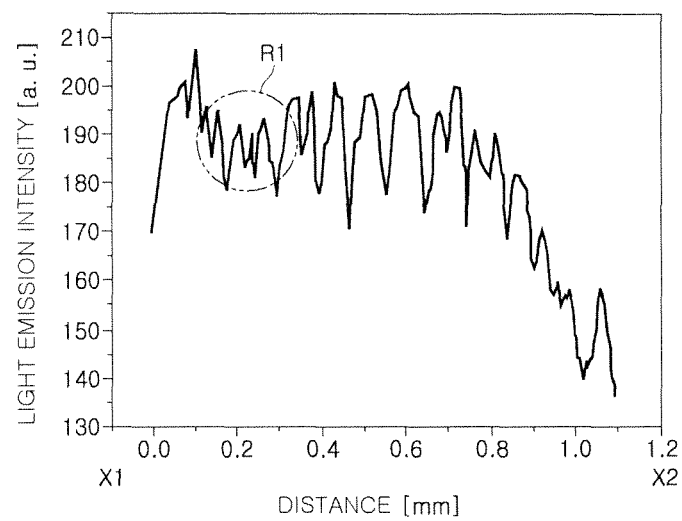
FIGS. 11A and 11B are graphs respectively illustrating light emission intensity distributions of Comparative Example 2 and Exemplary Embodiment 1 according to a longitudinal direction.
Figure 11B:
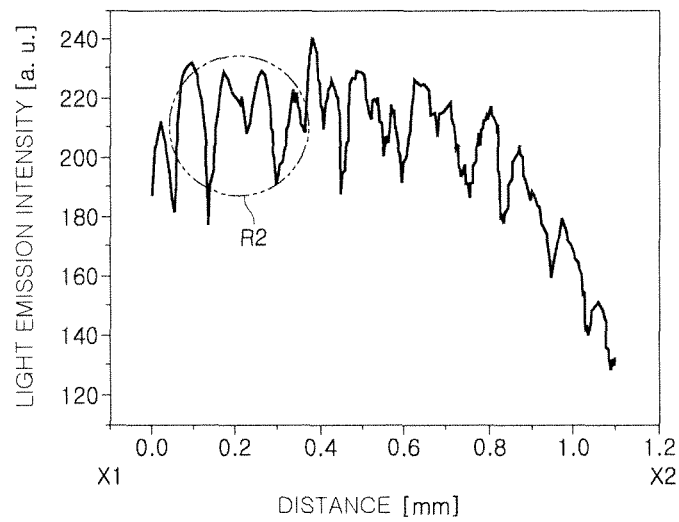

FIGS. 11A and 11B are graphs respectively illustrating light emission intensity distributions of Comparative Example 2 and Exemplary Embodiment 1 according to a longitudinal direction. FIGS. 11A and 11B show the light emission intensity distributions according to locations taken along line X1-X2 in the semiconductor light emitting devices illustrated in FIGS. 10B and 10C.

Referring to FIGS. 11A and 11B, the semiconductor light emitting device 100" according to Comparative Example 2 and the semiconductor light emitting device 100 according to Exemplary Embodiment 1 show similar light emission intensity distributions at areas (e.g. 0.8 to 1 mm distance section) below second electrode pad 116, but more or less largely different light emission intensity distributions at the areas R1 and R2 relatively far from the second electrode pad 116. More specifically, at an area (e.g. 0.1 to 0.3 distance section) spaced apart from the second electrode pad 116, Comparative Example 2 has relatively lower light emission intensity than at other areas adjacent to the second electrode pad 116 (see FIG. 11A), while Exemplary Embodiment 1 shows relatively uniform light emission intensity with no difference from the other areas adjacent to the second electrode pad 116.

It can be understood that currents are effectively distributed in the entire area due to the current spreading layer adopted in Exemplary Embodiment 1, and thereby current crowding problem at a local area is alleviated.

Figure 12:
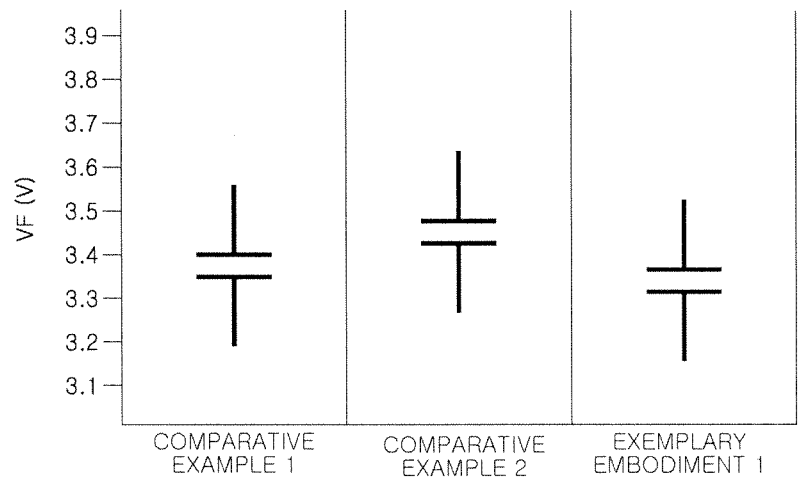
FIG. 12 is a graph illustrating operating voltages of semiconductor light emitting devices according to Comparative Examples 1 and 2 and Exemplary Embodiment 1, respectively.
Figure 13:
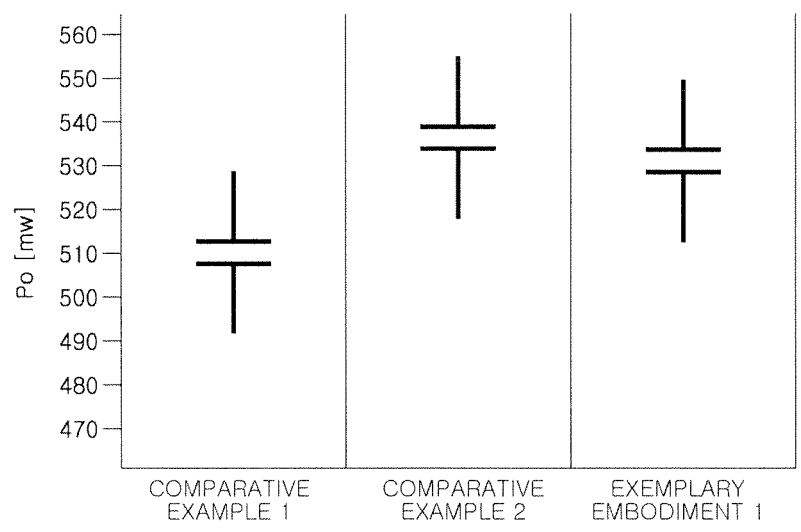
FIG. 13 is a graph illustrating light outputs of semiconductor light emitting devices according to Comparative Examples 1 and 2 and Exemplary Embodiment 1, respectively.

FIGS. 12 and 13 are graphs respectively illustrating operating voltages and light outputs of the semiconductor light emitting devices according to Comparative Examples 1 and 2 and Exemplary Embodiment 1.

Referring to FIG. 12, in terms of the operating voltages, the semiconductor light emitting device 100' according to Comparative Example 1 shows 3.378 V, and the semiconductor light emitting device 100" according to Comparative Example 2 shows 3.442 V increased by approximately 0.06 V from Comparative Example 1. On the contrary, the semiconductor light emitting device 100 according to Exemplary Embodiment 1 shows 3.346 V decreased by approximately 0.03 V from Comparative Example 1.

In the case of Comparative Example 2, the first contact electrode 111 is extended, but a current crowding phenomenon occurs in the area in which the first contact electrode 111 is extended, resulting in increase of the operating voltage. In Exemplary Embodiment 1, the current crowding phenomenon is alleviated by adopting the current spreading layer 114, and the first contact electrode 111 is extended to reduce the operating voltage.

Referring to FIG. 13, in terms of light output (Po), the semiconductor light emitting device 100" according to Comparative Example 2 shows a result improved by approximately 3.8% compared to Comparative Example 1, and the semiconductor light emitting device 100 according to Exemplary Embodiment 1 shows a result improved by approximately 2.3% compared to that of Comparative Example 1

In both of Comparative Example 2 and Exemplary Embodiment 1, the first contact electrode 111 extends to below the second electrode pad 116 to increase an effective light emitting area and thereby increase the light output. In terms of the light output, Comparative Example 2 shows a more improved result than Exemplary Embodiment 1, but the operating voltage may greatly increase in Comparative Example 2.

In this way, various types of electrodes such as a finger electrode may be designed to reduce an area that is not actually involved in light emission in the semiconductor light emitting device, and, as a result, light output of the semiconductor light emitting device can increase. In addition, by adopting the current spreading layer 114a, a current crowding problem generated due to a design of an electrode for increasing a light emitting area is alleviated, and the operating voltage is reduced.

In this way, since the current spreading layer 114 adopted in the exemplary embodiment of the present disclosure alleviates the current crowding problem generated due to a localized adjacent arrangement of electrodes, a degree of freedom in designing an electrode arrangement can increase. As a result, since an effective light emitting area increases, light output can be improved. Furthermore, the operating voltage can be significantly reduced by solving the current crowding problem.

The current spreading layer adopted in the exemplary embodiment of the present disclosure has a structure in which a first conductive layer and a second conductive layer having different resistivity from each other are stacked. The first conductive layer may include at least one selected from the group including one or more of Ti, V, Cr, Fe, Ni, Zn, Zr, Nb, Pt, Ta, Sn, TiN, Mn Pb, and Te, and the second conductive layer may include at least one selected from the group including one or more of Al, Cu, Cr, Ni, Au, Cu, W, Mo, Pd, Be, In, Os, Ir, Rh, TiW, and Ag. The first and second conductive layers may be appropriately selected from different respective metals.

The first conductive layer with a high resistivity may have a smaller thickness than the second conductive layer with a low resistivity. Changes in the operating voltage and the light output according to a thickness ratio of the first conductive layer to the second conductive layer were examined in Exemplary Embodiments A, B, and C.

Exemplary Embodiment A

A semiconductor light emitting device illustrated in FIG. 7 was fabricated. A current spreading layer adopted in the semiconductor light emitting device according to the exemplary embodiment of the present disclosure was fabricated by stacking alternately Ti and Al, which were a first conductive layer and a second conductive layer, respectively, three times. The Ti and Al layers are deposited to have the same thickness, that is, about 1000 Å.

Exemplary Embodiment B

A semiconductor light emitting device similar to that of Exemplary Embodiment A was fabricated. However, the thickness ratio of the first conductive layer to the second conductive layer configuring the current spreading layer was different from Exemplary Embodiments A.

A current spreading layer was formed in such a manner that the second conductive layer, or the Al layer was maintained at about 1000 Å, and the first conductive layer, or the Ti layer was changed to have a thickness of about 700 Å.

Exemplary Embodiment C

A semiconductor light emitting device similar to that of Exemplary Embodiment A was fabricated. However, the thickness ratio of the first conductive layer to the second conductive layer configuring the current spreading layer was different from that of Exemplary Embodiment A. A current spreading layer was formed in such a way that the second conductive layer, or the Al layer was maintained at about 1000 Å, and the first conductive layer, or the Ti layer was changed to have a thickness of about 400 Å, unlike that of Exemplary Embodiment B.

Figure 14:
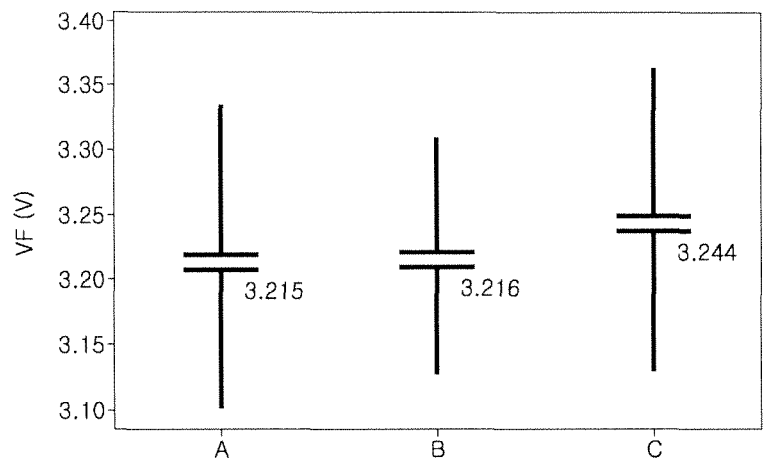
FIG. 14 is a graph illustrating operating voltages of semiconductor light emitting devices according to Exemplary Embodiment A, Exemplary Embodiment B, and Exemplary Embodiment C (according to the thickness of high resistivity conductive layers), respectively.
Figure 15:
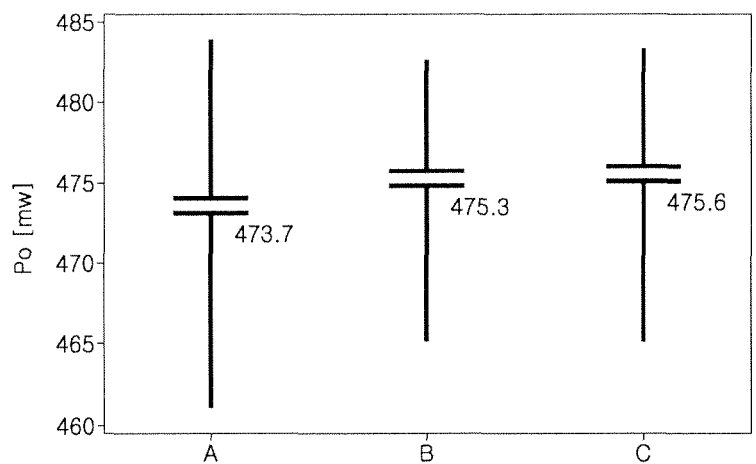
FIG. 15 is a graph illustrating light outputs of semiconductor light emitting devices according to Exemplary Embodiment A, Exemplary Embodiment B, and Exemplary Embodiment C (according to the thickness of high resistivity conductive layers), respectively.

FIGS. 14 and 15 are graphs respectively illustrating operating voltages and light outputs of the semiconductor light emitting devices according to Exemplary Embodiment A, Exemplary Embodiment B, and Exemplary Embodiment C.

Referring to FIG. 14, in terms of operating voltages ($V_F$), the semiconductor light emitting devices according to Exemplary Embodiment A and Exemplary Embodiment B show respectively 3.215 V and 3.216 V, and the semiconductor light emitting device according to Exemplary Embodiment C shows 3.244 V, greater than Exemplary Embodiment A by about 0.03 V.

Referring to FIG. 15, in terms of light outputs (Po), the semiconductor light emitting device according to Exemplary Embodiment A shows about 473.7 mW, and the semiconductor light emitting devices according to Exemplary Embodiment B and Exemplary Embodiment C show respectively about 475.3 mW and 475.6 mW, similar to each other.

Likewise, when the second conductive layer having high resistivity is thinner than the first conductive layer having low resistivity, the light output may increase. In addition, when the thickness ratio of the first conductive layer to the second conductive layer is excessively lowered, the light output is not further improved anymore, and the operating voltage is rather increased.

Referring to the above-described Exemplary Embodiments, in terms of light outputs and operating voltages, it is preferable that the first conductive layer is thinner than the second conductive layer, and, however, the thickness of the first conductive layer is maintained at 30% or more of the thickness of the second conductive layer.

FIGS. 16 to 25 are main process diagrams for describing a process of fabricating a semiconductor light emitting device according to an exemplary embodiment of the present disclosure.

Figure 16:
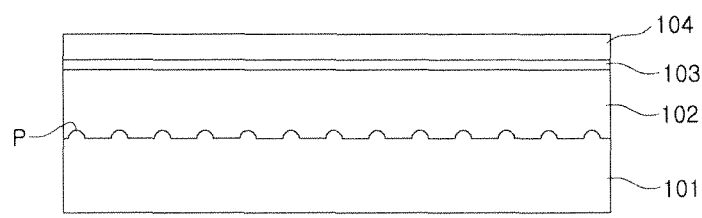
FIGS. 16 to 25 are main process diagrams for describing a process of fabricating a semiconductor light emitting device according to an exemplary embodiment of the present disclosure.

As illustrated in FIG. 16, a stacked semiconductor structure is formed by sequentially growing a first conductivity-type semiconductor layer 102, an active layer 103, and a second conductivity-type semiconductor layer 104 on a substrate 101.

The substrate 101 may be sapphire, SiC, Si, $MgAl_2O_4$, MgO, $LiAlO_2$, $LiGaO_2$, or GaN. A surface of the substrate 101 may include a hemispherical embossing structure P. The shape of the embossing structure P is not limited thereto, and the embossing structure P may have another polyhedral structured or irregular shaped emboss.

The stacked semiconductor structure may be grown on the substrate 101 using a metalorganic chemical vapor deposition (MOCVD), molecular beam epitaxy (MBE), or hydride vapor phase epitaxy (HVPE) process. The first conductivity-type semiconductor layer 102 may be a nitride semiconductor satisfying n-type $Al_xIn_yGa_{1-x-y}N$ ($0 \le x<1$, $0 \le y<1$, and $0 \le x+y<1$), and the n-type impurities may be Si. For example, the first conductivity-type semiconductor layer 102 may be n-type GaN. As the active layer 103, a MQW structure in which quantum well layers and quantum barrier layers are alternately stacked may be used. For example, when the active layer 13 is a nitride semiconductor, a GaN/InGaN structure may be used. In addition, the active layer 103 may have an SQW structure. The second conductivity-type semiconductor layer 14 may be a nitride semiconductor layer satisfying a p-type $Al_xIn_yGa_{1-x-y}N$ ($0 \le x<1$, $0 \le y<1$, and $0 \le x+y<1$), wherein the p-type impurities may be Mg. For example, the second conductivity-type semiconductor layer 14 may be p-type AlGaN/GaN.

Figure 17:
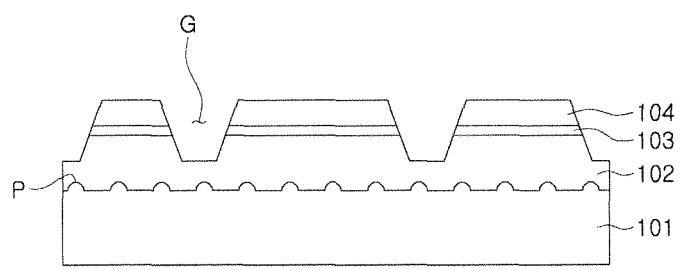
Figure 18:
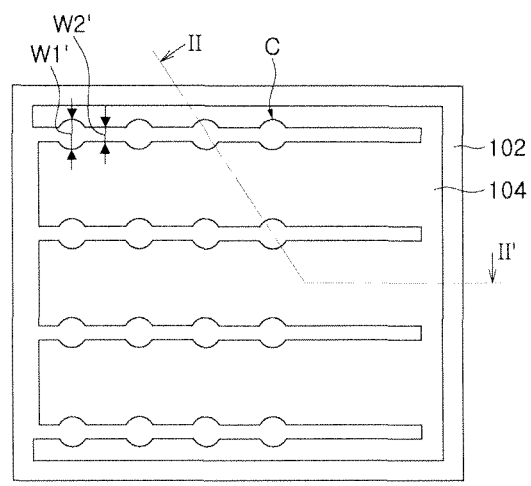

As illustrated in FIGS. 17 and 18, a groove G partially exposing the first conductivity-type semiconductor layer 102 may be formed by partially removing the active layer 103 and the second conductivity-type semiconductor layer 104.

The first conductivity-type semiconductor layer 102 exposed by the groove G may be provided as an area on which a first contact electrode is to be formed. The removal of the active layer 103 and the second conductivity-type semiconductor layer 104 may be executed in an etching process using a mask.

The laterally arranged four grooves G may be formed at an area in which a first electrode pad is to be formed, and further extend to an area in which the second electrode pad is to be formed. The groove G may include a plurality of contact areas C. The contact areas C may be located below the first electrode pad. The contact areas C may define connection areas between the first conductivity-type semiconductor layer 102 and the second electrode pad.

As illustrated in FIG. 18, a width W1' of the contact areas C may be greater than a width W2' of other areas than the groove G. The plurality of contact areas C may be arranged to have regular intervals in each groove G. One ends of the four grooves G may extend to an outer region through which a connection electrode connecting finger electrodes that are to be formed in the four grooves G may be provided.

As needed, as illustrated in FIG. 18, the first conductivity-type semiconductor layer 102 may be further exposed by removing the outer region of the stacked semiconductor structure, during the process of forming the grooves G.

Figure 19:
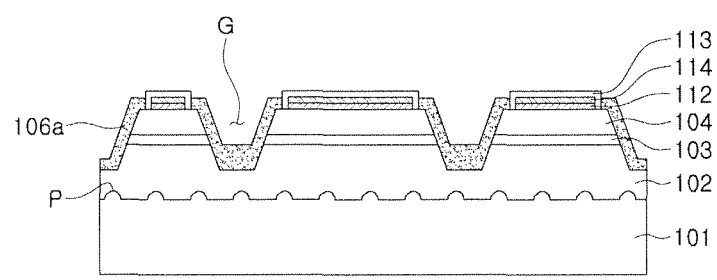
Figure 20:
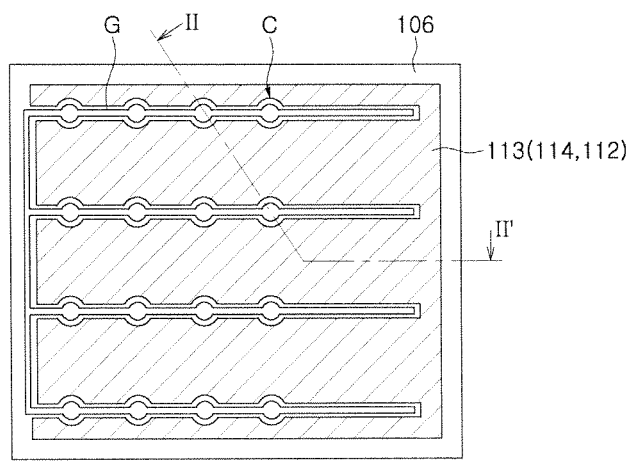

As illustrated in FIGS. 19 and 20, a second contact electrode 112, a current spreading layer 114, and a barrier layer 113 may be sequentially formed on an upper surface of the second conductivity-type semiconductor layer 104.

The process may include forming a first insulating layer 106a on the entire upper surface of the stacked semiconductor structure, exposing an area on which the second contact electrode 112 is to be formed, using a mask, and depositing a second contact electrode 112 on the exposed area.

The first insulating layer 106a may be $SiO_2$, SiN, or SiON. The second contact electrode 112 may include a material which forms an ohmic contact with the second conductivity-type semiconductor layer 104. As needed, the second contact electrode 112 may be implemented as a flip-chip structure by adopting a high reflective electrode material. For example, the second contact electrode 112 may include Ag or Ag/Ni.

A current spreading layer 114 may be formed on the second contact electrode 112. The current spreading layer 114 may have at least one area substantially corresponding to an area of the second contact electrode 112. The current spreading layer 114 may have a structure in which a first conductive layer having a first resistivity and a second conductive layer 114b having a second resistivity smaller than the first resistivity are alternately stacked (see FIG. 9).

A barrier layer 113 may be formed on the current spreading layer 114. The barrier layer 113 may be provided in the form of a cap covering the second contact electrode 112 and the current spreading layer 114. As described in the previous exemplary embodiments, a barrier layer, such as Ni/Ti, may be additionally formed, as needed.

The second contact electrode 112 may be formed on the almost entire upper surface of the second conductivity-type semiconductor layer 104. As illustrated in FIG. 20, the second contact electrode 112 may be formed on areas except an area adjacent to edges among the upper surface of the second conductivity-type semiconductor layer 104.

Figure 21:
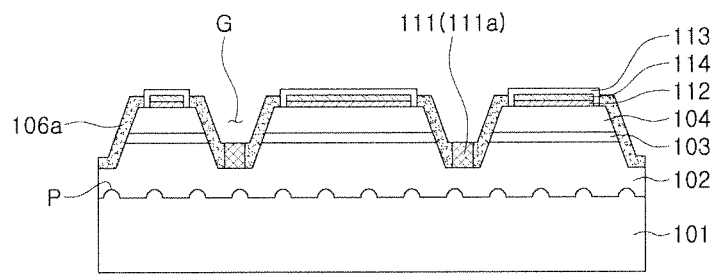
Figure 22:
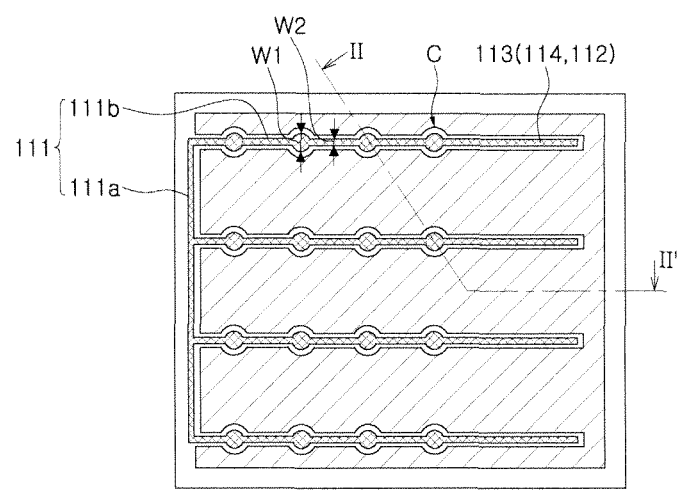

Next, as illustrated in FIGS. 21 and 22, a first contact electrode 111 is formed on an upper surface of the first conductivity-type semiconductor layer 102.

The process may be implemented by exposing an area of the first insulating layer 106a using another mask, wherein the first contact electrode 111 is to be formed on the area, and depositing the first contact electrode 111 on the exposed area. The first and second contact electrodes 111 and 112 may be electrically separated by the first insulating layer 106a.

The first conductivity-type semiconductor layer on which the first contact electrode 111 is formed may be defined by the plurality of grooves G and an area connecting one ends of the grooves G. In addition, the first contact electrode 111 may have a width w2 corresponding to the contact areas C, greater than a width w1 greater than width w1 of other areas, as illustrated in FIG. 22.

The first contact electrode 111 may include a material which forms an ohmic contact with the first conductivity-type semiconductor layer 102. The first contact electrode 111 may include, but not limited thereto, Ag, Ni, Al, Rh, Pd, Ir, Ru, Mg, Zn, Pt, or Au, and may have a single layered structure or a multilayered structure. As needed, the first contact electrode 111 may be implemented as a flip-chip structure by adopting a high reflective electrode material. For example, the first contact electrode 111 may include Cr/Au or Cr/Au/Pt. As described in the previous exemplary embodiments, a barrier layer 113 such as Ni/Ti may be additionally formed, as needed.

Figure 23:
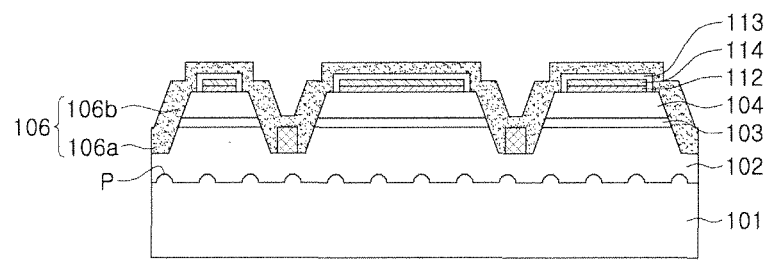

Next, as illustrated in FIG. 23, a second insulating layer 106b may be formed on the upper surface of the stacked semiconductor structure.

The second insulating layer 106b may be provided as a passivation layer 106 along with the first insulating layer 106a. The second insulating layer 106b may be formed of, but is not limited to, a similar material to that of the first insulating layer 106a. For example, the second insulating layer 106b may be $SiO_2$, SiN, or SiON.

Figure 24:
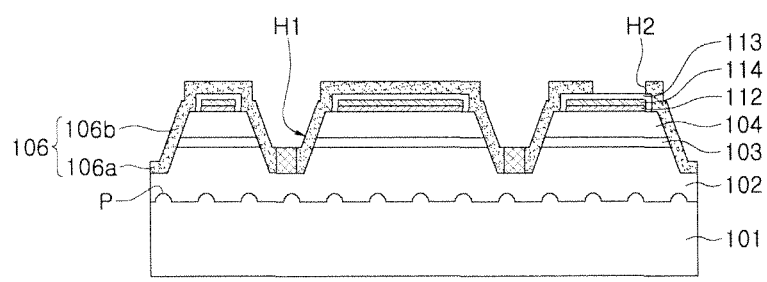

Next, as illustrated in FIG. 24, first and second openings H1 and H2 exposing portions of the first and second contact electrodes 111 and 112 may be formed on the second insulating layer 106b.

The process may include selectively etching the second insulating layer 106b using a mask for forming the first and second openings H1 and H2. Here, a plurality of first openings H1 are formed in positions corresponding to the contact area C to partially expose the first contact electrode 111. In the exemplary embodiment, sixteen first openings H1 may be formed to be exposed to contact areas C, respectively. In addition, three second opening H2 may be disposed between the second contact electrodes 112 (that is, the finger electrodes).

Figure 25:
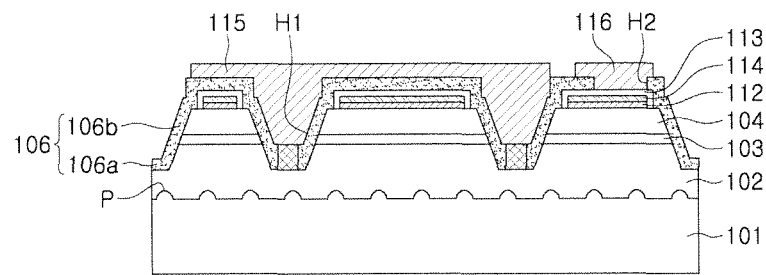

Next, as illustrated in FIG. 25, first and second electrode pads 115 and 116 may be formed.

The first electrode pad 115 may be connected to the contact area C of the first contact electrode 111 through the first opening H1, and the second electrode pad 116 may be connected to the second contact electrode 112 through the second opening H2.

The first and second electrode pads 115 and 116 may be disposed respectively adjacent to both opposite edges of the stacked semiconductor structure. The first electrode pad 115 may be located at least on the first openings H1, that is, the contact areas C. The second electrode pad 116 may be located on the second opening H2. In the exemplary embodiment, the finger electrodes of the first contact electrode 111 may be located not only below the first electrode pad 115 but also below the second electrode pad 116. Likewise, since the first contact electrode 111 extends to below the second electrode pad 116, the active region located below the second electrode pad 116 can contribute to light emission.

Figure 26:
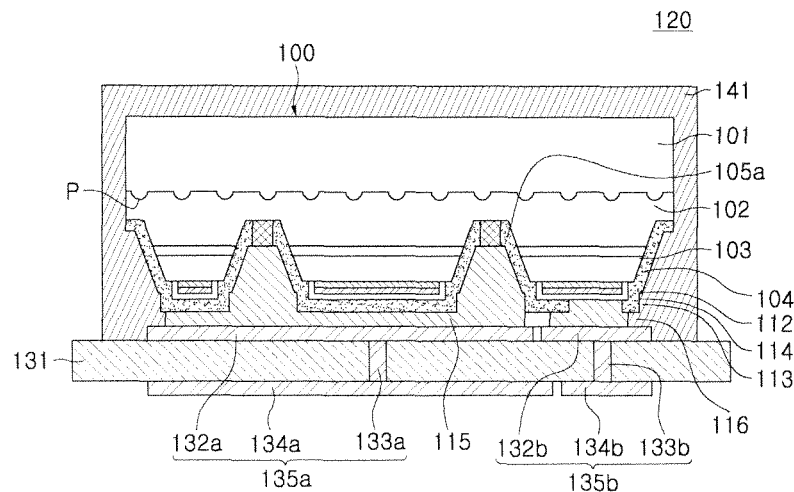
FIGS. 26 to 28 are cross-sectional views schematically illustrating various light-emitting modules according to exemplary embodiments of the present disclosure.
Figure 27:
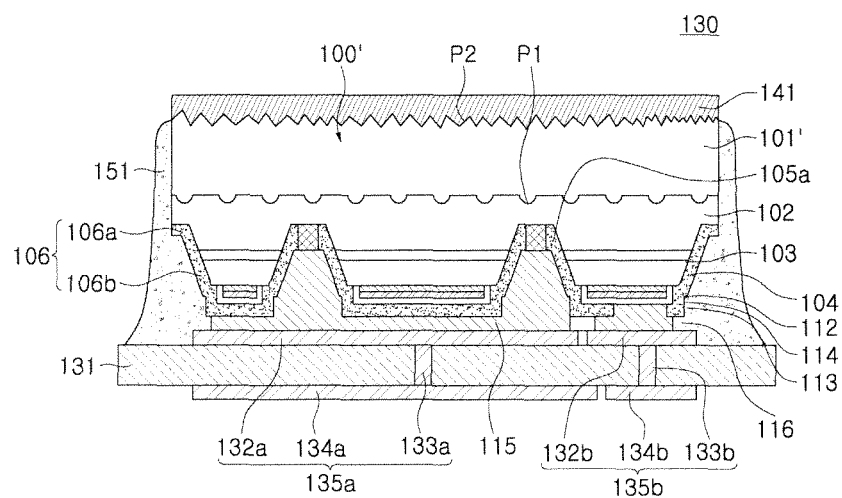

Meanwhile the semiconductor light emitting device having the above-described structure may be disposed on a mounting board or the like, to be utilized as a light-emitting module. The light-emitting module may be usefully used in a display device, such as a backlight unit, an indoor or outdoor illuminating device, and an electric field device. FIGS. 26 and 27 are cross-sectional views schematically illustrating a light-emitting module according to another exemplary embodiment of the present disclosure.

A light-emitting module 120 illustrated in FIG. 26 may include a circuit board 131 and a semiconductor light emitting device 100 mounted on the circuit board 131. The semiconductor light emitting device 100 may have the structure described in the previous exemplary embodiments.

The circuit board 131 may include first and second electrode structures 135a and 135b. Each of the first and second electrode structures 135a and 135b may include first and second upper electrodes 132a and 132b disposed on a top surface of the circuit board 131, first and second lower electrodes 133a and 133b disposed on a bottom surface of the circuit board 131, and first and second through electrodes 110a and 110b connecting the first and second upper electrodes 132a and 132b and the first and second lower electrodes 133a and 133b. However the circuit board 131 adopted in the exemplary embodiment is only an example, and may be applied in various forms. For example, the circuit board 131 may be a printed circuit board (PCB), such as a metal core PCB (MCPCB), a micro printed PCB (MPCB), and a flexible PCB (FPCB), a ceramic board, such as AlN and $Al_2O_3$, or a fixed lead frame-type board.

The semiconductor light emitting device 100 may be mounted on the circuit board 131 using a flip-chip bonding method. That is, the semiconductor light emitting device 100 may be mounted on the circuit board 131 in such a manner that the first and second electrode pads 115 and 116 face the circuit board 131. The first and second electrode pads 115 and 116 may include a bonding layer, for example, a eutectic metal layer formed thereon, and may be bonded to the first and second upper electrodes 131a and 131b using the bonding layer. Otherwise, the first and second electrode pads 115 and 116 and the first and second upper electrodes 131a and 131b may be bonded using an additional bonding layer, for example, a eutectic metal layer or a conductive epoxy.

As illustrated in FIG. 26, a wavelength conversion part 141 converting a wavelength of light emitted from the active layer 103 to another wavelength may be disposed on a surface of the semiconductor light emitting device 100. The wavelength conversion part 141 adopted in the exemplary embodiment may be a resin layer including a wavelength conversion material, such as a fluorescent material and a quantum dot.

A light-emitting module 130 illustrated in FIG. 27 may includes a circuit board 131 and a semiconductor light emitting device 100' mounted on the circuit board 131, similar to the light-emitting module 120 according to the above-described exemplary embodiment.

The semiconductor light emitting device 100' may include a different substrate 101' from the semiconductor light emitting device 100 illustrated in FIG. 26. Embosses may be formed on each opposite surface of the substrate 101'. Embosses P1 having a curvature may be formed on a surface which is a growth surface, and irregular embosses P2 may be formed on the other surface. A wavelength conversion part 141' may be formed on a surface on which irregular embosses P2 are formed.

In the exemplary embodiment, a reflecting member 151 may be provided on a side surface of the semiconductor light emitting device 100' mounted on the circuit board 131. The reflecting member 151 may be a transparent resin including a reflecting pillar. As the reflecting pillar, a metal powder or a white ceramic powder that have a high reflectance may be used. For example, the reflecting pillar may be a material selected from $TiO_2$, $Al_2O_3$, $Nb_2O_5$, $Al_2O_3$, and ZnO, and, in particular, a white powder, such as $TiO_2$ and $Al_2O_3$. The transparent resin may be epoxy resin or silicon resin.

Figure 28:
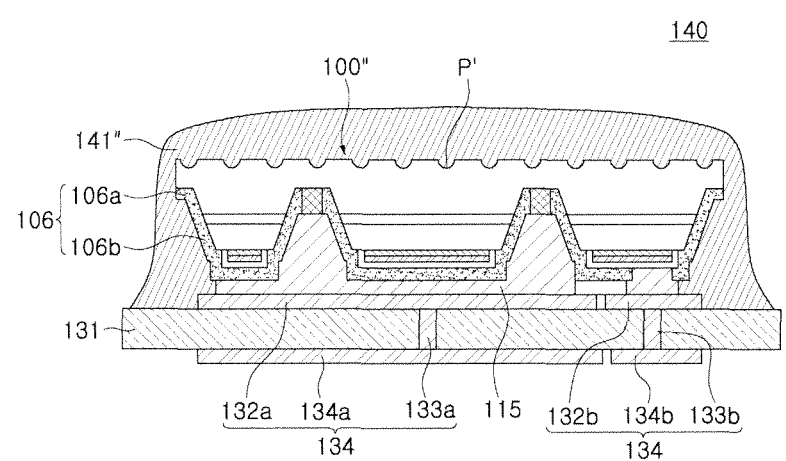

A light-emitting module 140 illustrated in FIG. 28 may include a circuit board 131 and a semiconductor light emitting device 100" mounted on the circuit board 131, similar to the above-described exemplary embodiment.

Unlike the semiconductor light emitting device 100 illustrated in FIG. 26, a substrate 101 may be removed from the semiconductor light emitting device 100". Embosses P' may be formed on a surface on which the substrate 101 has been removed. The semiconductor light emitting device 100" may be mounted on the circuit board 131 on which the substrate 101 has been removed, similar to the above-described exemplary embodiment. A wavelength conversion part 141" may be formed on the semiconductor light emitting device 100" mounted on the circuit board 131.

Figure 29A:
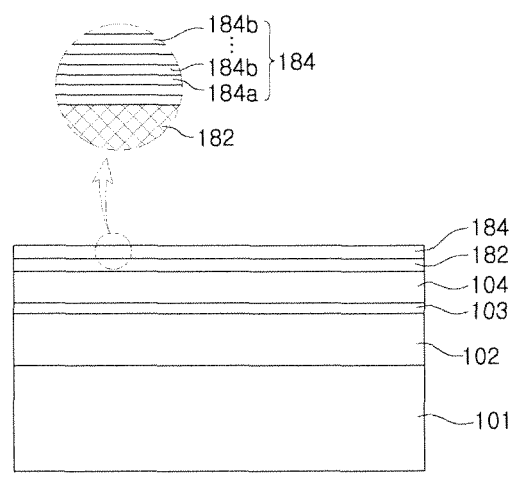
FIGS. 29A and 29B are process cross-sectional views for describing a modified method of fabricating a semiconductor light emitting device according to an exemplary embodiment of the present disclosure.
Figure 29B:
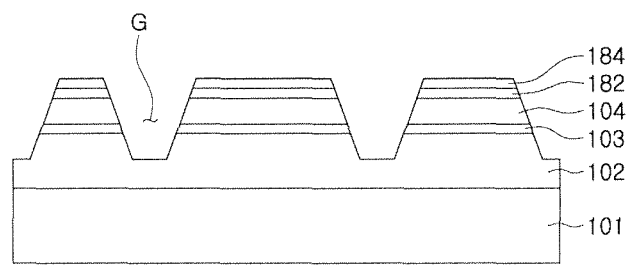

FIGS. 29A and 29B are process cross-sectional views for describing a method of fabricating a semiconductor light emitting device according to another exemplary embodiment of the present disclosure.

As illustrated in FIG. 29A, a stacked semiconductor structure including a first conductivity-type semiconductor layer 102, an active layer 103, and a second conductivity-type semiconductor layer 104 may be formed on a substrate 101, and subsequently a second contact electrode 182 and a current spreading layer 184 may be formed without forming a groove. Next, as illustrated in FIG. 29B, a groove G may be formed by removing the second contact electrode 182 and the current spreading layer 184 along with the stacked semiconductor structure.

In the exemplary embodiment, since a mask for forming the second contact electrode 182 and the current spreading layer 184 is not used, process efficiency may be improved. After the groove G is formed, processes similar to those in the previous exemplary embodiment may be applied. For example, a process of forming a first contact electrode in the groove G, a process of forming an insulating layer, a process of forming an opening in the insulating layer, and a process of forming first and second electrode pads may be performed sequentially.

The nitride semiconductor light emitting device according to the exemplary embodiments of the present disclosure may be used in various applied products.

Figure 30:
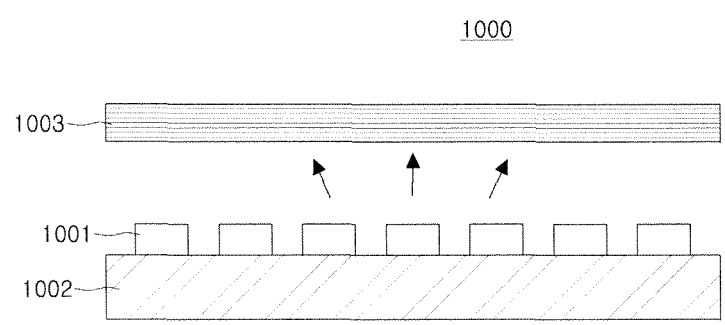
FIGS. 30 and 31 illustrate a backlight unit including a semiconductor light emitting device or a light-emitting module having the semiconductor light emitting device according to an exemplary embodiment of the present disclosure.
Figure 31:
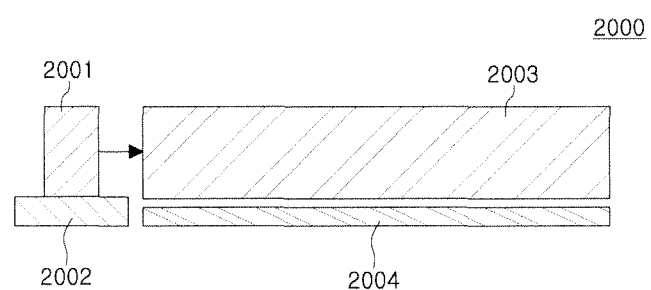

FIGS. 30 and 31 illustrate a backlight unit including a semiconductor light emitting device or a light-emitting module having the semiconductor light emitting device according to an exemplary embodiment of the present disclosure.

Referring to FIG. 30, a backlight unit 1000 may include a light source 1001 mounted on a substrate 1002, and one or more optical sheet 1003 disposed on the light source 1001. The light source 1001 may used the above-described semiconductor light emitting device or light-emitting module.

The light source 1001 in the backlight unit 1000 illustrated in FIG. 30 emits light toward a top surface where a liquid crystal display (LCD) is disposed. On the contrary, in another backlight unit 2000 illustrated in FIG. 31, a light source 2001 mounted on a substrate 2002 emits light in a lateral direction, and the emitted light is incident to a light guide plate 2003 and converted to the form of surface light. Light passing through the light guide plate 2003 is emitted upwardly, and a reflective layer 2004 may be disposed on a bottom surface of the light guide plate 2003 to improve light extraction efficiency.

Figure 32:
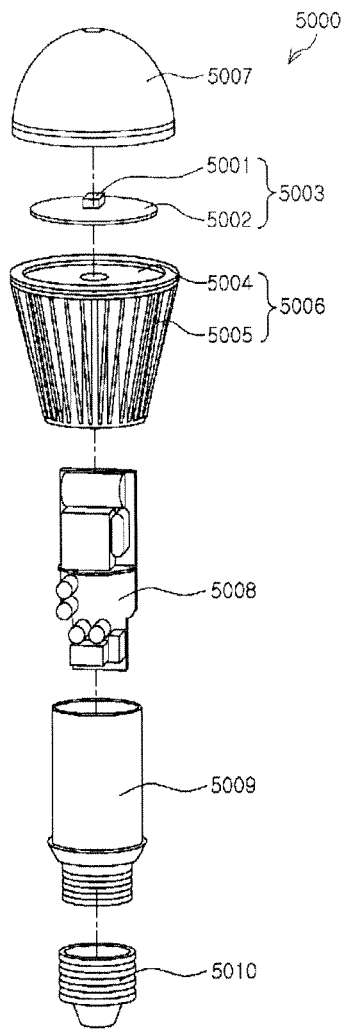
FIG. 32 is an exploded perspective view illustrating an illumination apparatus including a semiconductor light emitting device (or a light-emitting module) according to an exemplary embodiment of the present disclosure.

FIG. 32 is an exploded perspective view illustrating an illumination apparatus including a semiconductor light emitting device or a light-emitting module having the semiconductor light emitting device according to an exemplary embodiment of the present disclosure.

An illumination apparatus 5000 illustrated in FIG. 32 is a bulb-type lamp as an example, and includes a light-emitting module 5003, a driving unit 5008, and an external connection portion 5010.

In addition, external structures, such as external and internal housings 5006 and 5009 and a cover 5007, may be further included. The light-emitting module 5003 may include the above-described nitride semiconductor light emitting device or a light source 5001 having the same, and a circuit board 5002 with the light source 5001 mounted thereon. For example, the first and second electrode of the above-described semiconductor light emitting device may be electrically connected to an electrode pattern of the circuit board 5002. In the exemplary embodiment, a single light source 3001 is mounted on the circuit board 5002, but a plurality of light sources 3001 may be mounted as needed.

The external housing 5006 may function as a heat dissipation unit, and include a heat dissipation plate 5004 in direct contact with the light-emitting module 5003 to enhance a heat dissipation effect, and a heat radiation fin 5005 surrounding a side surface of the illumination apparatus 5000. The cover 5007 may be installed on the light-emitting module 5003, and have a convex lens shape. The driving unit 3008 may be installed in the internal housing 3009 and connected to the external connection portion 3010, such as a socket structure, to receive power from an external power source. In addition, the driving unit 3008 may function to convert the power to an appropriate current source capable of driving the light source 5001 of the light-emitting module 5003. For example, the driving unit 5008 may be configured as an AC-DC converter, a rectifying circuit component, or the like.

Figure 33:
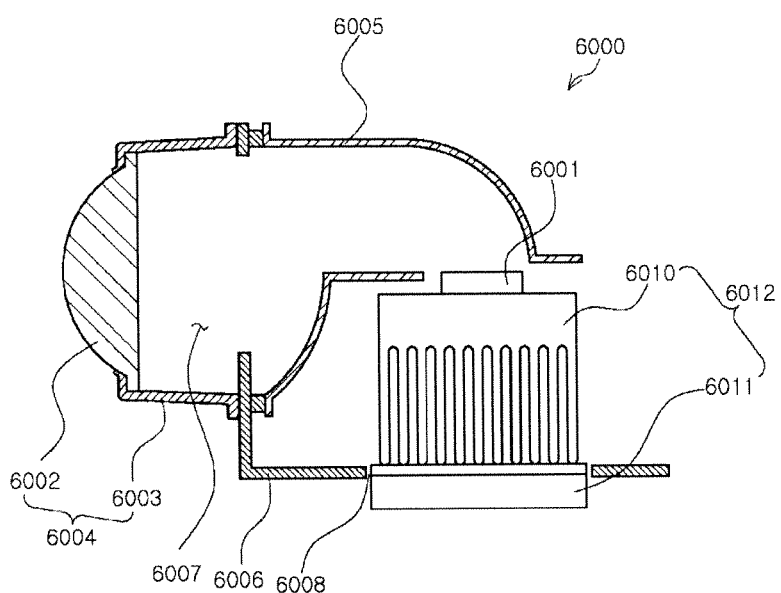
FIG. 33 illustrates a headlamp including a semiconductor light emitting device (or a light-emitting module) according to an exemplary embodiment of the present disclosure.

FIG. 33 illustrates an example in which a semiconductor light emitting device or a light-emitting module including the same according to an exemplary embodiment of the present disclosure is applied to a headlamp.

Referring to FIG. 33, headlamp 6000 used as a vehicle lamp, or the like, may include a light source 6001 a reflective unit 6005, and a lens cover unit 6004. The lens cover unit 6004 may include a hollow-type guide 6003 and a lens 6002. The light source 6001 may include the above-described semiconductor light emitting device or a package having the same.

The headlamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. In addition, the headlamp 6000 may further include a housing 6006 fixedly supporting the heat dissipation unit 6012 and the reflective unit 6005, and the housing 6006 may have a central hole 6008 formed on one surface thereof, in which the heat dissipation unit 6012 is coupled and installed.

The housing 6006 may have a front hole 6007 formed on the other surface integrally connected to the one surface and bent in a right angle direction. The front hole 6007 may allow the reflective unit 6005 to be fixedly positioned above the light source 6001. Accordingly, a front side is opened by the reflective unit 6005, and the reflective unit 6005 is fixed to the housing 6006 such that the opened front side corresponds to the front hole 6007, and light reflected by the reflective unit 6005 may pass through the front hole 6007 so as to be emitted outwardly.

According to the exemplary embodiments of the present disclosure, a current spreading layer including conductive layers having different resistivity (or electrical conductivity) from each other is provided. Thus, a semiconductor light emitting device capable of preventing degradation of light emission efficiency due to a current crowding phenomenon and improving light output can be provided.

While exemplary embodiments have been shown and described above, it will be apparent to those skilled in the art that modifications and variations could be made without departing from the spirit and scope of the present disclosure as defined by the appended claims.

What is claimed is:

1. A semiconductor light emitting device, comprising:
    a stacked semiconductor structure including a first conductivity-type semiconductor layer having a top surface divided into a first region and a second region, and an active layer and a second conductivity-type semiconductor layer disposed sequentially on the second region of the first conductivity-type semiconductor layer;
    a first contact electrode disposed in the first region of the first conductivity-type semiconductor layer;
    a second contact electrode disposed on the second conductivity-type semiconductor layer;
    a current spreading layer disposed on the second contact electrode and in which a first conductive layer having a first resistivity and a second conductive layer having a second resistivity smaller than the first resistivity are alternately stacked;
    a first electrode pad electrically connected to the first contact electrode; and
    a second electrode pad disposed on a portion of the current spreading layer and electrically connected to the second contact electrode.

2. The semiconductor light emitting device of claim 1, wherein a thickness of the first conductive layer is less than a thickness of the second conductive layer.

3. The semiconductor light emitting device of claim 2, wherein the thickness of the first conductive layer is about 30% or more of the thickness of the second conductive layer.

4. The semiconductor light emitting device of claim 1, wherein the first conductive layer includes at least one selected from the group consisting of Ti, V, Cr, Fe, Ni, Zn, Zr, Nb, Pt, Ta, Sn, TiN, Mn, Pb, and Te, and the second conductive layer includes at least one selected from the group consisting of Al, Cu, Cr, Ni, Au, Cu, W, Mo, Pd, Be, In, Os, Ir, Rh, TiW, and Ag.

5. The semiconductor light emitting device of claim 1, further comprising an insulating layer disposed on the stacked semiconductor structure and including a first opening exposing a portion of the first contact electrode and a second opening exposing a portion of the current spreading layer,
    wherein the first electrode pad is connected to the first contact electrode through the first opening, and the second electrode pad is connected to the current spreading layer through the second opening.

6. The semiconductor light emitting device of claim 5, wherein a portion in which the first opening is disposed has a greater width than other portions of the first region adjacent to the first opening in the first region.

7. The semiconductor light emitting device of claim 5, wherein the first contact electrode includes at least one finger electrode, and the first opening includes a plurality of first openings, and
    the plurality of first openings are arranged to be spaced apart from each other on the finger electrode.

8. The semiconductor light emitting device of claim 7, wherein the second opening includes a plurality of second openings, and
    the finger electrode extends to between the plurality of second openings.

9. The semiconductor light emitting device of claim 8, wherein the first opening is located below the second electrode pad.

10. The semiconductor light emitting device of claim 8, wherein the finger electrode includes a plurality of finger electrodes.

11. The semiconductor light emitting device of claim 1, wherein the current spreading layer has at least one area substantially corresponding to an area of the second contact electrode.

12. The semiconductor light emitting device of claim 11, wherein the second contact electrode is disposed in an area other than an area adjacent to an edge of a top surface of the second conductivity-type semiconductor layer.

13. The semiconductor light emitting device of claim 1, wherein at least one of the first and second contact electrodes is at least one metal selected from the group consisting of Al, Ag, Ni, Rh, Pd, Ir, Ru, Mg, Zn, Pt, Au, Cr, and Ti.

14. The semiconductor light emitting device of claim 1, further comprising a barrier layer interposed between the second contact electrode and the current spreading layer, or between the current spreading layer and the second electrode pad.

15. The semiconductor light emitting device of claim 14, wherein the barrier layer is at least one metal selected from the group consisting of Ni, Al, Cu, Cr, Ti, and combinations thereof.

16. A light emitting module comprising:
    a circuit board including a first electrode structure and a second electrode structure; and
    a semiconductor light emitting device, mounted on the circuit board, described in claim 1,
    wherein first and second electrode pads of the semiconductor light emitting device are respectively connected to the first and second electrode structures.

17. An illuminating apparatus, comprising:
    a light emitting module including a semiconductor light emitting device described in claim 1;
    a driving unit configured to drive the light emitting module; and
    an external connection portion configured to supply an external voltage to the driving unit.

18. A semiconductor light emitting device, comprising:
    a stacked semiconductor structure including a first conductivity-type semiconductor layer having a top surface divided into a first region and a second region, and an active layer and a second conductivity-type semiconductor layer disposed sequentially on the second region of the first conductivity-type semiconductor layer;
    a first contact electrode disposed in the first region of the first conductivity-type semiconductor layer and including a plurality of finger electrodes;
    a second contact electrode disposed on a top surface of the second conductivity-type semiconductor layer;
    a current spreading layer disposed on the second contact electrode and in which a first conductive layer having a first resistivity and a second conductive layer having a second resistivity smaller than the first resistivity are alternately stacked;

an insulating layer disposed on the stacked semiconductor structure and including a first opening exposing a portion of the first contact electrode and a second opening exposing a portion of the current spreading layer;

a first electrode pad disposed on a portion of the insulating layer and electrically connected to the first contact electrode through the first opening; and a second electrode pad disposed on another portion of the insulating layer and electrically connected to the current spreading layer.

19. The semiconductor light emitting device of claim 18, wherein the first and second openings include a plurality of first and second openings, respectively, the plurality of first openings are arranged to be spaced apart from each other on the plurality of finger electrodes, and the plurality of finger electrodes extend between the plurality of second openings.

20. The semiconductor light emitting device of claim 18, wherein the first and second electrode pads are disposed adjacently to two opposite edges of the semiconductor light emitting device, and the plurality of finger electrodes extend from below the first electrode pad to below the second electrode pad.

\* \* \* \* \*